(12) United States Patent
Huang et al.

(10) Patent No.: US 9,136,276 B1
(45) Date of Patent: Sep. 15, 2015

(54) MEMORY CELL STRUCTURE AND METHOD FOR FORMING THE SAME

(71) Applicant: UNITED MICROELECTRONICS CORP., Hsin-Chu (TW)

(72) Inventors: Ya-Huei Huang, Tainan (TW); Sung-Bin Lin, Hsinchu (TW); Wen-Chung Chang, Hsinchu (TW); Feng-Ji Tsai, Hsinchu (TW); Yen-Ting Ho, Taipei (TW); Chien-Hung Chen, Hsin-Chu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/255,977

(22) Filed: Apr. 18, 2014

(51) Int. Cl.
*H01L 27/115* (2006.01)
*H01L 29/792* (2006.01)
*H01L 29/66* (2006.01)

(52) U.S. Cl.
CPC .... *H01L 27/11568* (2013.01); *H01L 29/66833* (2013.01)

(58) Field of Classification Search
CPC .............. H01L 29/66492; H01L 29/66833; H01L 29/7835; H01L 29/792; H01L 29/7923
USPC ............................. 438/275; 257/324
See application file for complete search history.

(56) References Cited

U.S. PATENT DOCUMENTS

| 7,301,219 | B2 | 11/2007 | Hsu et al. | |
|---|---|---|---|---|
| 2004/0183106 | A1* | 9/2004 | Kim et al. | ............ 257/239 |
| 2007/0108508 | A1 | 5/2007 | Lin et al. | |
| 2011/0095348 | A1* | 4/2011 | Chakihara et al. | ............ 257/298 |

* cited by examiner

*Primary Examiner* — Daniel Shook
(74) *Attorney, Agent, or Firm* — Winston Hsu; Scott Margo

(57) ABSTRACT

A method for forming a memory cell structure includes following steps. A substrate including at least a memory cell region defined thereon is provided, and a first gate stack is formed in the memory cell region. A first LDD implantation is performed to form a first LDD at one side of the first gate stack in the memory cell region, and the first LDD includes a first conductivity type. A second LDD implantation is performed to form a second LDD at one side of the first gate stack opposite to the first LDD in the memory cell region, and the second LDD includes the first conductivity type. The first LDD and the second LDD are different from each other.

17 Claims, 10 Drawing Sheets

MEMORY CELL STRUCTURE AND METHOD FOR FORMING THE SAME

BACKGROUND OF THE INVENTION

1. Field of the Invention

The invention relates to a memory cell structure and method for forming the same, and more particularly, to an asymmetric memory cell structure and method for forming the same.

2. Description of the Prior Art

Semiconductor memory devices are prevalently used in computer and electronics industries as a means for retaining digital information. Typically, the semiconductor memory devices are divided into volatile and non-volatile memory devices depending on whether the data stored in the memory devices is completely lost or not in case of power interruption. And the non-volatile memory devices, which can retain their data even when the power supply is interrupted, have been widely employed.

In the conventional non-volatile memory technology, a silicon-oxide-nitride-oxide-semiconductor (hereinafter abbreviated as SONOS) memory structure is to build a silicon nitride layer sandwiched between two silicon oxide layers for serving as the charge trap layer while the two silicon oxide layers respectively serve as a charge tunnel layer and a charge block layer. This oxide-nitride-oxide (ONO) multilayered structure is further formed between a semiconductor substrate and a silicon floating gate, and thus a SONOS memory structure is constructed.

In operation, a high electric field is induced thus electrons or holes are accelerated and injected into the oxide charge tunnel layer from the source. The nitride charge trap layer traps the electrons or holes that penetrate through the charge tunnel layer. And the oxide charge block layer prevents the electrons or holes that escape the charge trap layer from reaching the silicon during program or erase operations.

When erasing information recorded in the SONOS memory structure, an electric field, in an opposite direction to that used when programming, is formed by applying a predetermined voltage to the gate after the substrate is grounded. Accordingly, the electrons or holes are removed from the charge tunnel layer and back to the drain.

It is therefore concluded that the electric fields between the substrate and the SONOS memory structures play important roles during programming and erasing the information.

SUMMARY OF THE INVENTION

According to an aspect of the present invention, a method for forming a memory cell structure is provided. According to the provided method, a substrate including at least a memory cell region defined thereon is provided, and a first gate stack is formed in the memory cell region. Next, a first lightly-doped drain (hereinafter abbreviated as LDD) implantation is performed to form a first LDD at one side of the first gate stack in the memory cell region, and the first LDD includes a first conductivity type. A second LDD implantation is performed to form a second LDD at one side of the first gate stack opposite to the first LDD in the memory cell region, and the second LDD includes the first conductivity type. More important, the first LDD and the second LDD are different from each other.

According to another aspect of the present invention, a memory cell structure is provided. The provided memory cell structure includes a substrate, a gate stack formed on the substrate, a first LDD formed in the substrate at one side of the gate stack, and a second LDD formed in the substrate at another side of the gate stack opposite to the first LDD. The first LDD and the second LDD include a same conductivity type but the first LDD and the second LDD are different from each other.

According to still another aspect of the present invention, a method for forming a memory cell structure is provided. According to the provided method, a substrate comprising at least a memory cell region defined thereon is provided. Next, a first ion implantation is performed to form a first doped region in the memory cell region and followed by forming a first gate stack in the memory cell region. The first doped region includes a first conductivity type. Subsequently, a first LDD implantation is performed to form a first LDD at one side of the first gate stack in the memory cell region, and a second LDD implantation is performed to form a second LDD at one side of the first gate opposite to the first LDD in the memory cell region. The first LDD and the second LDD include a second conductivity type that is complementary to the first conductivity type. More important, the first LDD and the second LDD are different from each other.

According to the present invention, an asymmetric memory cell structure is provided by forming the first LDD and the second LDD different from each other. Thus, the electric field between the first LDD and the gate stack is different from the electric field between the second LDD and the gate stack.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-4 are schematic drawings illustrating a method for forming a memory cell structure provided by a first preferred embodiment of the present invention, wherein FIG. 2 is a schematic drawing in a step subsequent to FIG. 1, FIG. 3 is a schematic drawing illustrating a modification to the first preferred embodiment, and FIG. 4 is a schematic drawing in a step subsequent to FIG. 2.

FIGS. 5-8 are schematic drawings illustrating a method for forming a memory cell structure provided by a second preferred embodiment of the present invention, wherein FIG. 6 is a schematic drawing in a step subsequent to FIG. 5, FIG. 7 is a schematic drawing in a step subsequent to FIG. 6, and FIG. 8 is a schematic drawing in a step subsequent to FIG. 7.

FIGS. 9-10 are schematic drawings illustrating a method for forming a memory cell structure provided by a third preferred embodiment of the present invention, wherein FIG. 10 is a schematic drawing in a step subsequent to FIG. 9.

DETAILED DESCRIPTION

Figure 1:
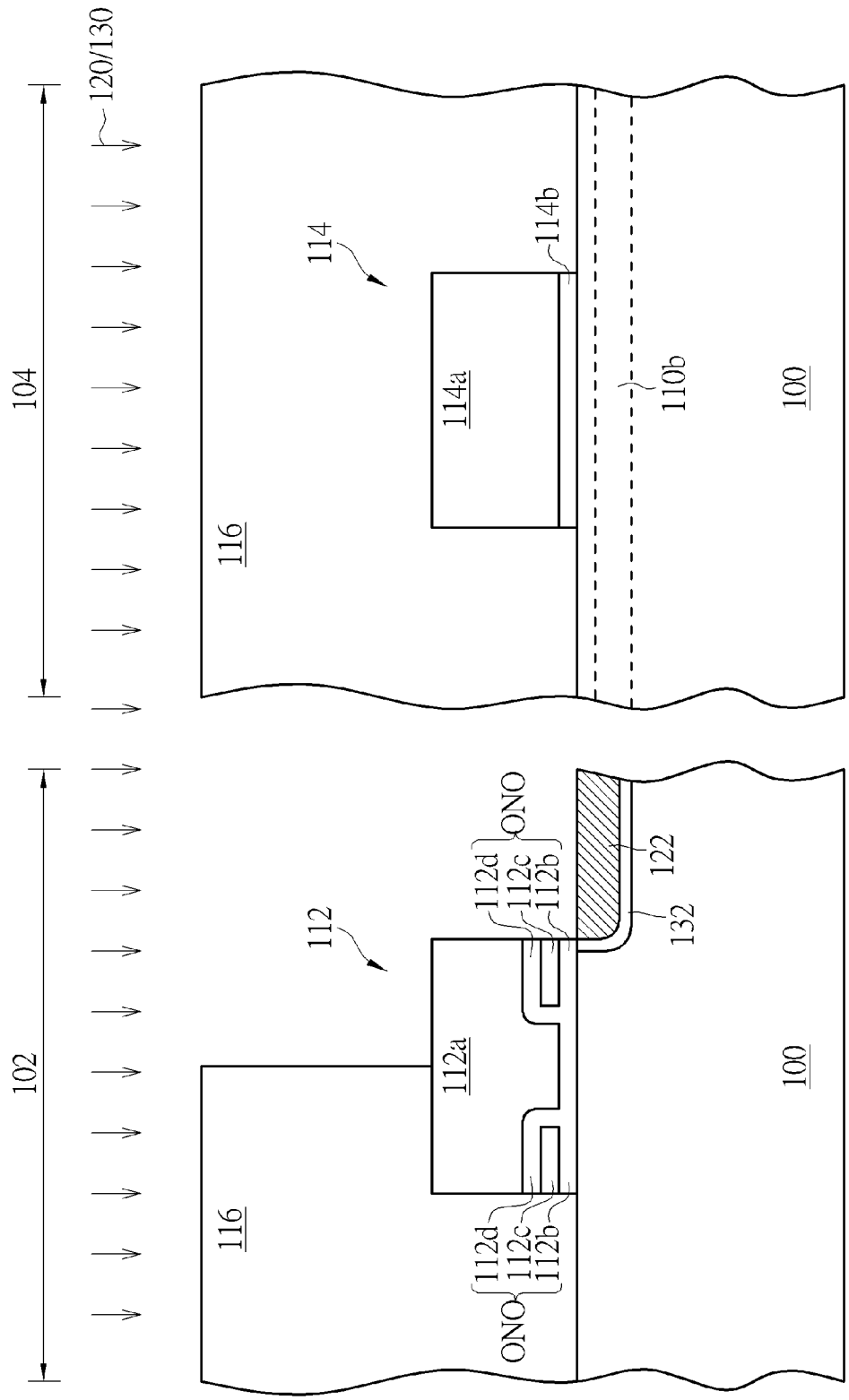

FIGS. 1-4 are schematic drawings illustrating a method for forming a memory cell structure provided by a first preferred embodiment of the present invention. According to the first preferred embodiment, a substrate 100 is provided. The substrate 100 includes a memory cell region 102 and a logic region 104 defined therein. At least a first gate stack 112 is formed in the memory cell region 102 and at least a second gate stack 114 is formed in the logic region 104. The first gate stack 112 includes a polysilicon gate layer 112a, two silicon oxide layers 112b/112d, and a silicon nitride layer 112c sandwiched between the two silicon oxide layers 112b/112d. The two silicon oxide layers 112b/112d and the silicon nitride layer 112c sandwiched therebetween construct an oxide-nitride-oxide (hereinafter abbreviated as ONO) structure. More important, each first gate stack 112 includes two ONO structures formed therein as shown in FIG. 1. Accordingly, the first gate stack 112 is a SONOS-type memory cell gate, particularly a 2-bit SONOS-type memory cell gate. On the other hand, the second gate stack 114 includes a gate layer 114a spaced apart from the substrate 100 by a gate dielectric layer 114b.

It is noteworthy that an ion implantation is always performed to form a doped region 110b in the logic region 104 as shown in FIG. 1. Those skilled in the art would easily realize that the threshold voltage (Vt) is defined as the gate voltage that must be applied to the gate to attract electrons to the surface of the substrate to form an electrically conductive inversion region in the channel region (i.e., the voltage required to turn the transistor on). And the threshold voltage of the transistor may be altered or adjusted by implanting the surface of the substrate in the channel region with a dopant. The abovementioned ion implantation is referred to as a threshold voltage adjustment implant or a Vt adjustment implant, and the doped region 110b is formed to alter or adjust the threshold voltage of the second gate stack 114. The doped region 110b includes a dopant of a first conductivity type, in accordance with the preferred embodiment, the first conductivity type is p type. However, no Vt adjustment implant is performed in the memory cell region 102 in accordance with the preferred embodiment.

Please refer to FIG. 1 again. Next, a patterned mask 116 is formed on the substrate 100. It is noteworthy that the patterned mask 116 covers and protects the entire logic region 104 and portions of the memory cell region 102 as shown in FIG. 1. Then a first LDD implantation 120 is performed to implant a dopant of a second conductivity type into the substrate 100 exposed by the patterned mask 116. Consequently a first LDD 122 is formed in the substrate 100 at one side of the first gate stack 112 in the memory cell region 102. The second conductivity type is complementary to the first conductivity type. According to the preferred embodiment, the second conductivity type is n type and the first LDD implantation 120 is to implant, for example but not limited to, arsenic (As) to form the first LDD 122. An implant energy of the first LDD implantation 120 is between 5 KeV and 10 KeV, and a dose of the first LDD implantation 120 is between $1*10^{14}$ ions/cm$^2$ and $5*10^{15}$ ions/cm$^2$, but not limited to this. Accordingly, the preferred embodiment is to provide at least an n-type memory cell structure in the memory cell region 102 and at least an n-type device in the logic region 104.

Please still refer to FIG. 1. After the first LDD implantation 120, a first pocket implantation 130 is performed to implant a dopant of the second conductivity type into the substrate 100 exposed by the patterned mask 116. And thus a first pocket doped region 132 around the first LDD 122 is formed in the substrate 102 as shown in FIG. 1. According to the preferred embodiment, the first pocket implantation 130 is to implant, for example but not limited to, boron (B) to form the first pocket doped region 132. An implant energy of the first pocket implantation 130 is between 10 KeV and 40 KeV, and a dose of the first pocket implantation 130 is between $1*10^{13}$ ions/cm$^2$ and $1*10^{14}$ ions/cm$^2$, but not limited to this.

Figure 2:
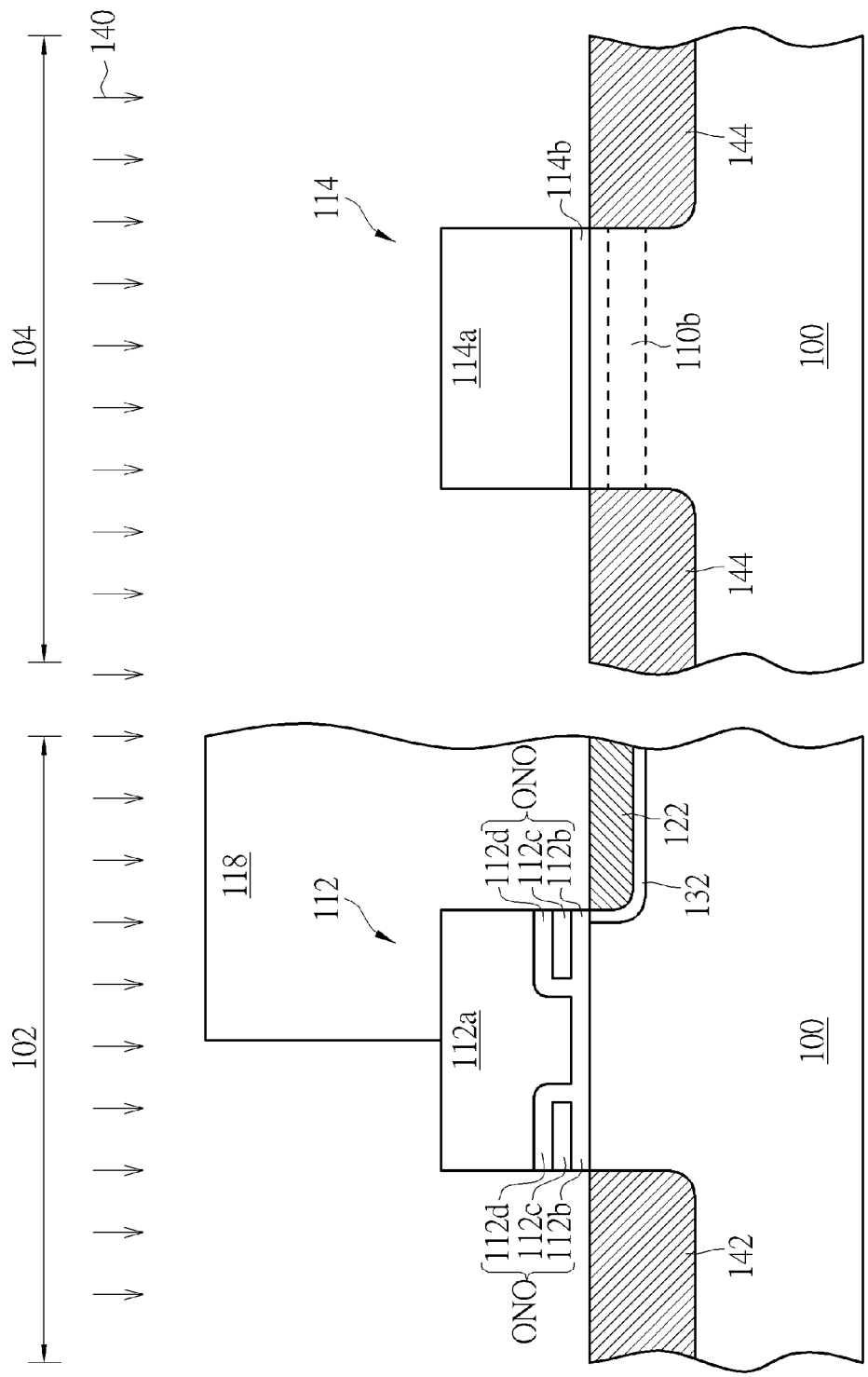

Please refer to FIG. 2. Next, another patterned mask 118 is formed on the substrate 100. It is noteworthy that the patterned mask 118 covers and protects portions of the memory cell region 102 and portions of the logic region 104. Particularly, the patterned mask 118 protects the portion of the memory cell region 102 where p-type devices are to be formed in accordance with the preferred embodiment. Then a second LDD implantation 140 is performed to implant a dopant of the second conductivity type into the substrate 100 exposed by the patterned mask 118. Consequently, a second LDD 142 is formed in the substrate 100 at another side of the first gate stack 112 opposite to the first LDD 122 in the memory cell region 102. More important, the second implantation 140 is performed to simultaneously form third LDDs 144 in the substrate 100 at two sides of the second gate stack 114 in the logic region 104. According to the preferred embodiment, the second LDD implantation 140 is to implant phosphorous (P) to form the second LDD 142 and the third LDDs 144, but not limited to this. An implant energy of the second LDD implantation 140 is between 30 KeV and 80 KeV, and a dose of the second LDD implantation 140 is between $1*10^{13}$ ions/cm$^2$ and $1*10^{14}$ ions/cm$^2$. It should be noted that the first LDD 122 and the second LDD 142 include the same conductivity type but the first LDD 122 and the second LDD 142 are different from each other. In a modification to the preferred embodiment, the first LDD 122 and the second LDD 142 can include different dopants. For example but not limited to this, the first LDD 122 includes arsenic while the second LDD 142 includes phosphorus. In another modification to the preferred embodiment, a concentration of the first LDD 122 is different from a concentration of the second LDD 142. For example, the concentration of the first LDD 122 is larger than the concentration of the second LDD 142. Instill another modification to the preferred embodiment, a depth of the first LDD 122 is different from a depth of the second LDD 142. For example, the depth of the first LDD 122 is lower than the depth of the second LDD 142.

Figure 3:
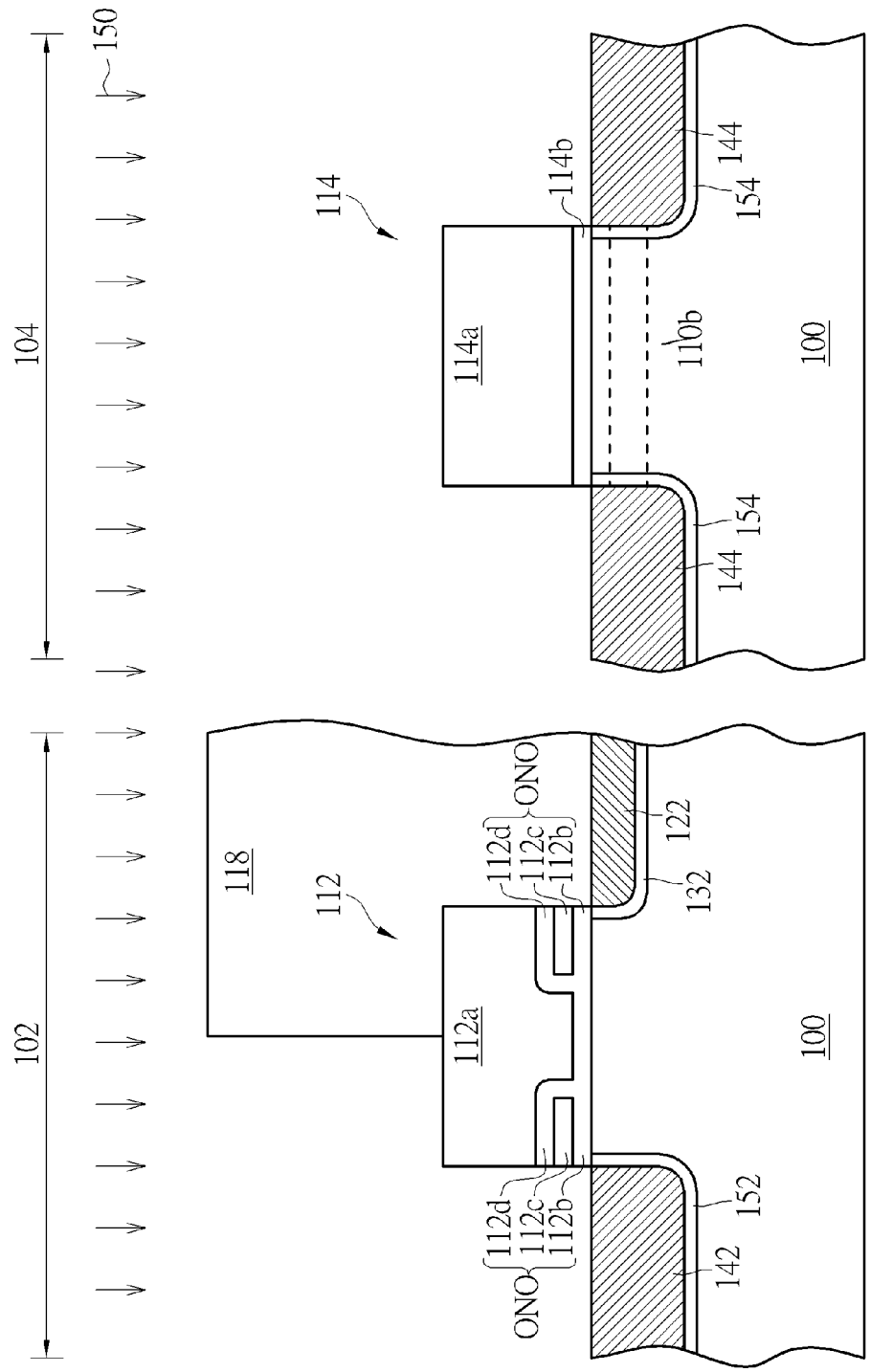

Please refer to FIG. 3, which is a schematic drawing illustrating a modification to the first preferred embodiment. According to the modification, a second pocket implantation 150 is performed to implant a dopant of the first conductivity type into the substrate 100 exposed by the patterned mask 118. Thus a second pocket doped region 152 around the second LDD 142 is formed in the memory cell region 102 and third packet doped regions 154 around the third LDDs 144 are formed in the logic region 104 as shown in FIG. 3. According to the modification, the second pocket implantation 150 is to implant, for example but not limited to, boron to form the second pocket doped region 152 and the third pocket doped regions 154. An implant energy of the second pocket implantation 150 is between 10 KeV and 40 KeV, and a dose of the second pocket implantation 150 is between $1*10^{13}$ ions/cm$^2$ and $1*10^{14}$ ions/cm$^2$, but not limited to this.

Figure 4:
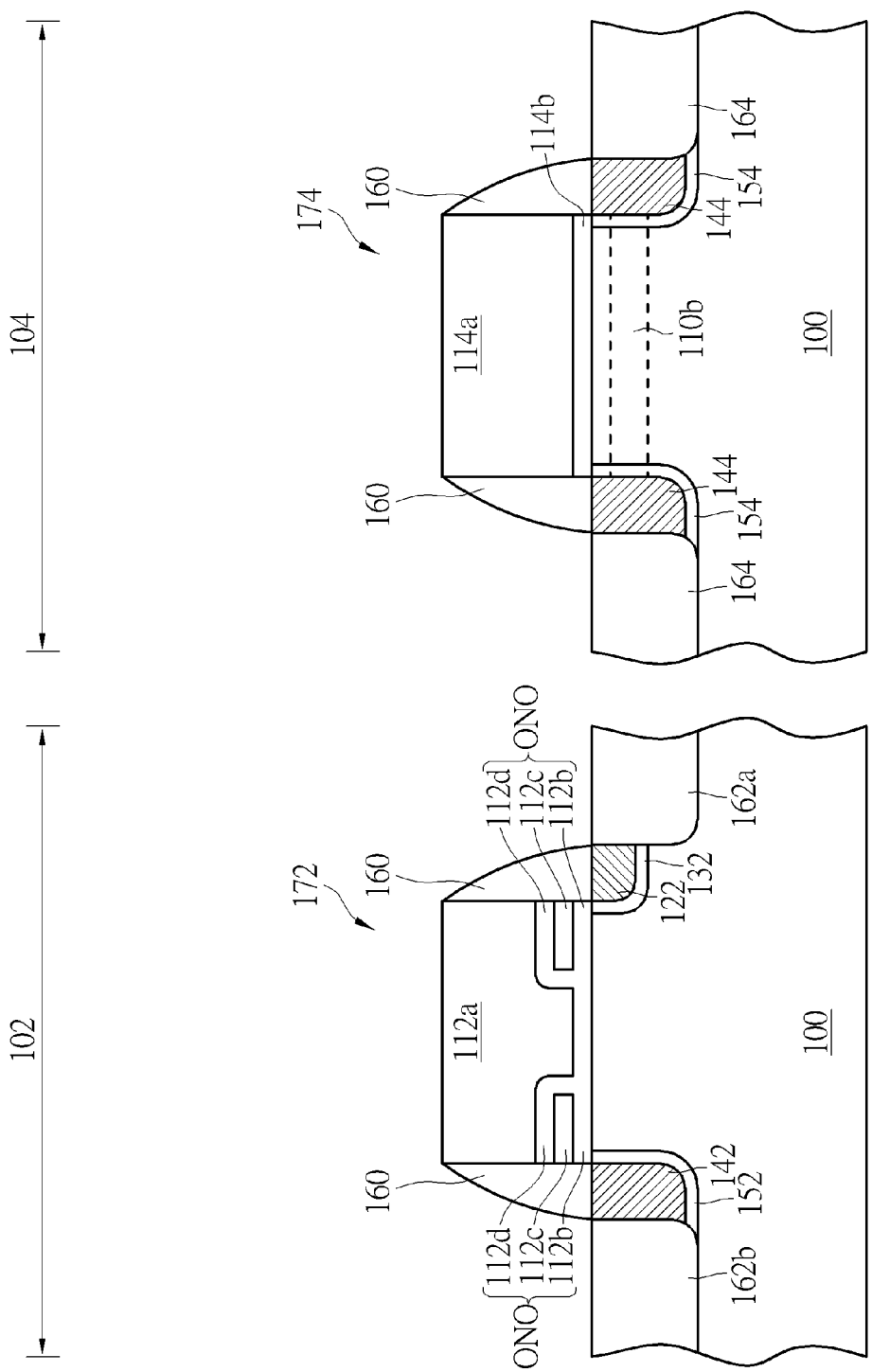
Figure 5:
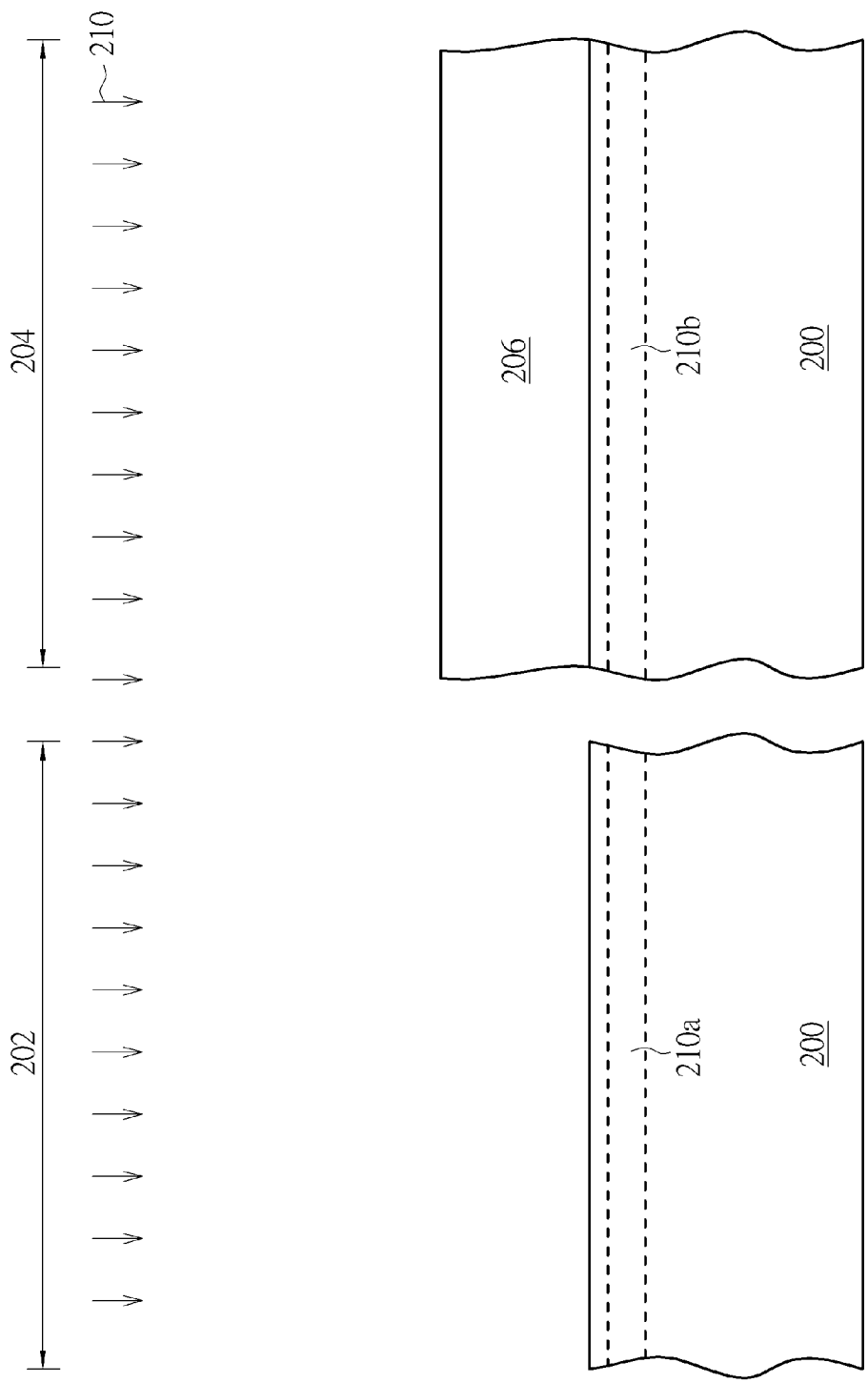

Please refer to FIG. 4. After forming the second LDD 142 and the third LDDs 144, and after selectively forming the second pocket doped region 152 and the third pocket doped regions 154, a spacer 160 is respectively formed on sidewalls of the first gate stack 112 and of the second gate stack 114. Subsequently, an ion implantation is performed to form a source region 162a in the substrate 100 at the first LDD 122 side and a drain region 162b in the substrate 100 at the second LDD 142 side. Additionally, another ion implantation is performed to form a source/drain 164 in the substrate 100 at two sides of the second gate stack 114 in the logic region 104. Accordingly, an asymmetric memory cell structure 172 including the first LDD 122 and the second LDD 142 different from each other is obtained in the memory cell region 102 and a metal-oxide-semiconductor (hereinafter abbreviated as MOS) transistor 174 is obtained in the logic region 104.

According to the method for forming the memory cell structure provided by the first preferred embodiment and the modification, the conventionally required Vt implantation performed to the memory cell region 102 is eliminated. More important, the second LDD implantation 140 that is conventionally required to form the third LDDs 144 in the logic region 104, is now performed to further form the second LDD 142 in the memory cell region 102, simultaneously. It can be easily realized that a photolithography (for the Vt implantation in the memory cell region 102) is economized and the memory cell structure 172 is formed without complicating the process. More important, the obtained memory cell structure 172 is an asymmetric memory cell structure including the first LDD 122 and the second LDD 142 different from each other. Accordingly, the first LDD 122 and the second LDD 142 can include different dopants, a concentration of the first LDD 122 can be different from a concentration of the second LDD 142, and/or a depth of the first LDD 122 can be different from a depth of the second LDD 142. The second LDD 142 different from the first LDD 122 is formed at the drain side, also referred to the bit line side, and provides lower electric field. Specifically, the electric field in erasing operation is lower than the electric field in programming.

Please refer to FIGS. 5-8, which are schematic drawings illustrating a method for forming a memory cell structure provided by a second preferred embodiment of the present invention. Please refer to FIG. 5. According to the second preferred embodiment, a substrate 200 is provided. The substrate 200 includes a memory cell region 202 and a logic region 204 defined therein. A patterned mask 206 is formed to cover and protect the entire logic region 204 and portions of the memory cell region 202. Subsequently, a first ion implantation 210 is performed to form a first doped region 210a in the memory cell region 202, and the first doped region 210a includes a first conductivity type. In the preferred embodiment, the first conductivity type includes p type. Accordingly, the first ion implantation 210 is to implant, for example but not limited to, boron to form the first doped region 210a. An implant energy of the first ion implantation 210 is between 20 KeV and 60 KeV, and a dose of the first ion implantation 210 is between $1*10^{12}$ ions/cm$^2$ and $1*10^{13}$ ions/cm$^2$, but not limited to this. It should be noted that, another ion implantation (not shown) is performed to form a second doped region 210b in the logic region 202. The abovementioned first ion implantation 210 and the second ion implantation are referred to as threshold voltage adjustment implants or Vt adjustment implants. That is, the first doped region 210a and the second doped region 210b are formed to alter or adjust the threshold voltages of the gate stacks respectively formed in the memory cell region 202 and the logic region 204 in following steps. It is also should be noted that the first ion implantation 210 and the second ion implantation are referred to different ion implantations, but the step order of the abovementioned first ion implantation 210 and second ion implantation is not limited to this. Accordingly, the preferred embodiment is to provide at least an n-type memory cell structure in the memory cell region 202 and at least an n-type device in the logic region 204.

Figure 6:
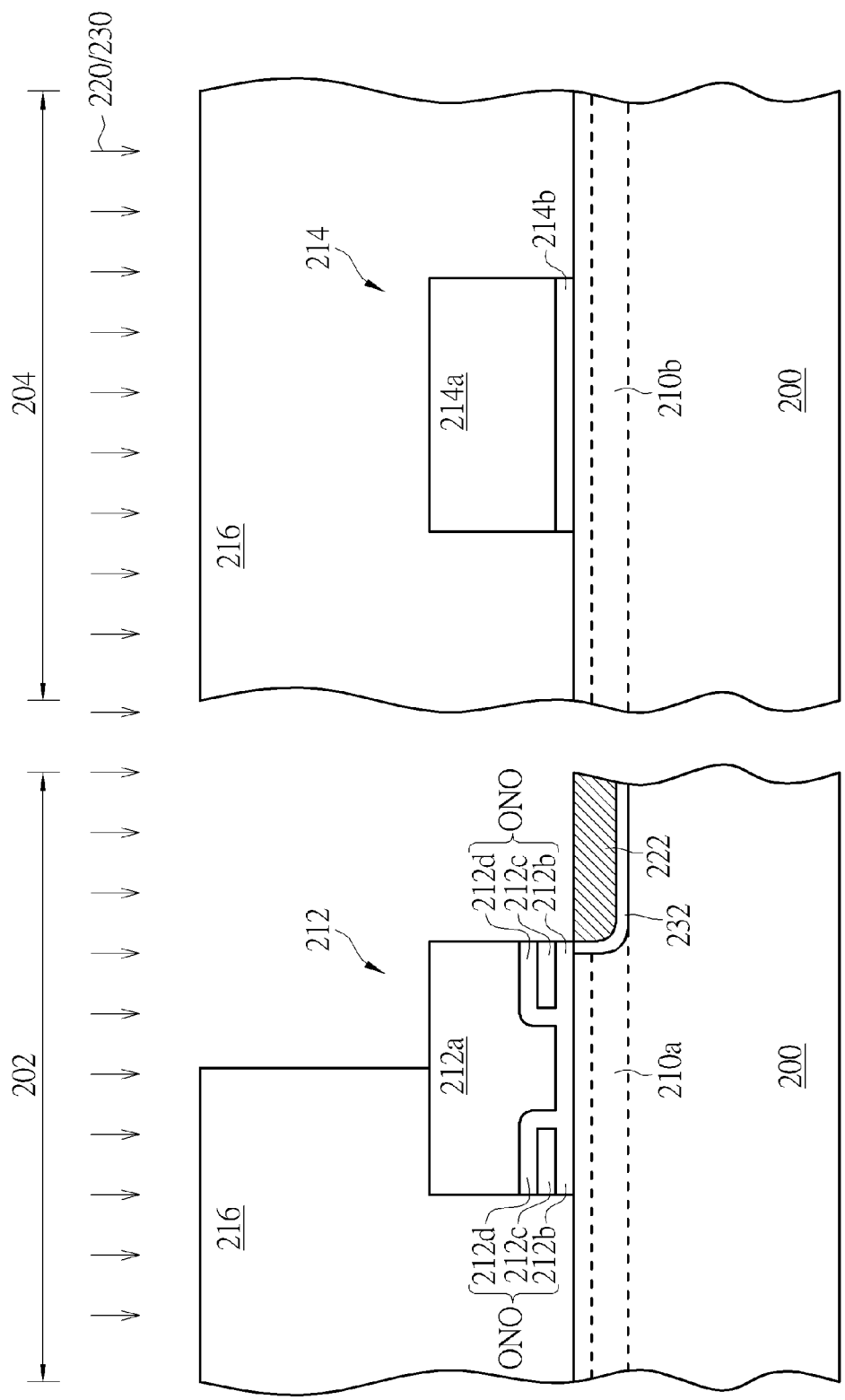

Please refer to FIG. 6. Next, at least a first gate stack 212 is formed in the memory cell region 202 and at least a second gate stack 214 is formed in the logic region 204. The first gate stack 212 includes a polysilicon gate layer 212a, two silicon oxide layers 212b/212d, and a silicon nitride layer 212c sandwiched between the two silicon oxide layers 212b/212d. The two silicon oxide layers 212b/212d and the silicon nitride layer 212c sandwiched therebetween construct an ONO structure. More important, each first gate stack 212 includes two ONO structures formed therein as shown in FIG. 6. Accordingly, the first gate stack 212 is a SONOS-type memory cell gate, particularly a 2-bit SONOS-type memory cell gate. On the other hand, the second gate stack 214 includes a gate layer 214a spaced apart from the substrate 200 by a gate dielectric layer 214b.

Please refer to FIG. 6 again. After forming the first gate stack 212 and the second gate stack 214, a patterned mask 216 is formed on the substrate 200. It is noteworthy that the patterned mask 216 covers and protects the entire logic region 204 and portions of the memory cell region 202 as shown in FIG. 6. Then, a first LDD implantation 220 is performed to implant a dopant of a second conductivity type into the substrate 200 exposed by the patterned mask 216. Consequently, a first LDD 222 is formed in the substrate 200 at one side of the first gate stack 212 in the memory cell region 202. The second conductivity type is complementary to the first conductivity type. In accordance to the preferred embodiment, the second conductivity type is n type and the first LDD implantation 220 is to implant, for example but not limited to, arsenic to form the first LDD 222. An implant energy and a dose of the first LDD implantation 220 are the same with those of the first LDD implantation 120 described in the first preferred embodiment and thus those details are omitted in the interest of brevity.

Please still refer to FIG. 6. After the first LDD implantation 220, a first pocket implantation 230 is performed to implant a dopant of the first conductivity type into the substrate 200 exposed by the patterned mask 216. And thus a first pocket doped region 232 around the first LDD 222 is formed in the substrate 202 and as shown in FIG. 6. According to the preferred embodiment, the first pocket implantation 230 is to implant, for example but not limited to, boron to form the first pocket doped region 232. An implant energy and a dose of the first pocket implantation 230 are the same with those of the first pocket implantation 130 described in the first preferred embodiment and thus those details are omitted in the interest of brevity.

Figure 7:
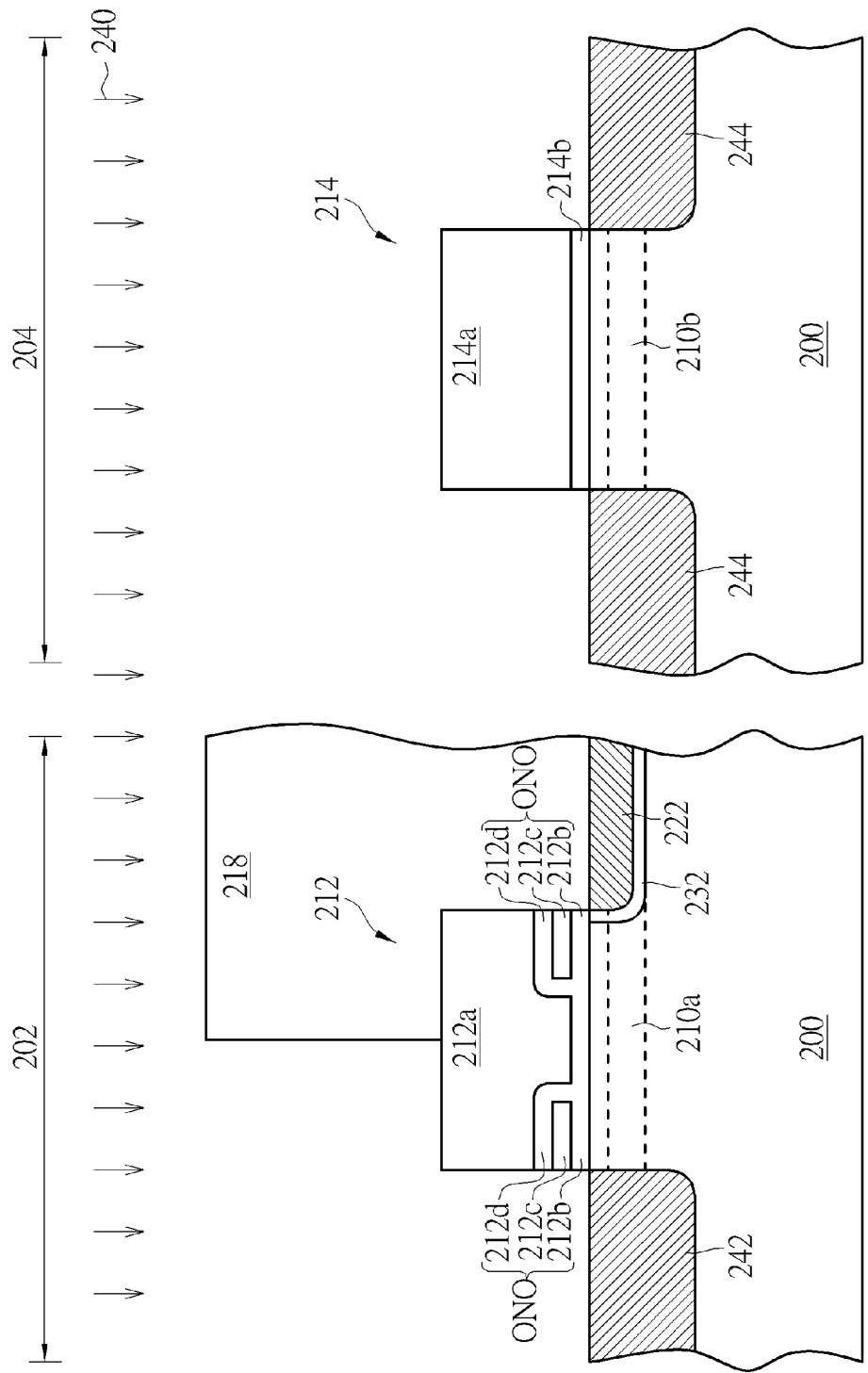

Please refer to FIG. 7. Next, another patterned mask 218 is formed on the substrate 200. It is noteworthy that the patterned mask 218 covers and protects portions of the memory cell region 202 and portions of the logic region 204. Particularly, the patterned mask 218 protects the portion of the memory cell region 202 where p-type devices are to be formed in accordance with the preferred embodiment. Then, a second LDD implantation 240 is performed to implant a dopant of the second conductivity type into the substrate 200 exposed by the patterned mask 218. Consequently, a second LDD 242 is formed in the substrate 200 at another side of the first gate stack 212 opposite to the first LDD 222 in the memory cell region 202. More important, the second implantation 240 is performed to simultaneously form third LDDs 244 in the substrate 200 at two sides of the second gate stack 214 in the logic region 204. According to the preferred embodiment, the second LDD implantation 240 is to implant, for example but not limited, phosphorus to form the second LDD 242 and the third LDDs 244. An implant energy and a dose of the second LDD implantation 240 are the same with those of the second LDD implantation 140 described in the first preferred embodiment and thus those details are omitted in the interest of brevity. It should be noted that the first LDD 222 and the second LDD 242 include the same conductivity type but the first LDD 222 and the second LDD 242 are different from each other. In a modification to the preferred embodiment, the first LDD 222 and the second LDD 242 can include different dopants. For example but not limited to this, the first LDD 222 includes As while the second LDD 242 includes P. In another modification to the preferred embodiment, a concentration of the first LDD 222 is different from a concentration of the second LDD 242. For example, the concentration of the first LDD 222 is larger than the concentration of the second LDD 242. In still another modification to the preferred embodiment, a depth of the first LDD 222 is different from a depth of the second LDD 242. For example, the depth of the first LDD 222 is lower than the depth of the second LDD 242.

Additionally, according to a modification to the second preferred embodiment, a second pocket implantation (not shown) can be performed to implant a dopant of the first conductivity type into the substrate 200 exposed by the patterned mask 218 if required. Thus a second pocket doped region (not shown) around the second LDD 242 is formed in the memory cell region 202 and third packet doped regions (not shown) around the third LDDs 244 are formed in the logic region 204. Details of the second pocket implantation are the same with those of the second pocket implantation described in the first preferred embodiment and thus are omitted in simplicity.

Figure 8:
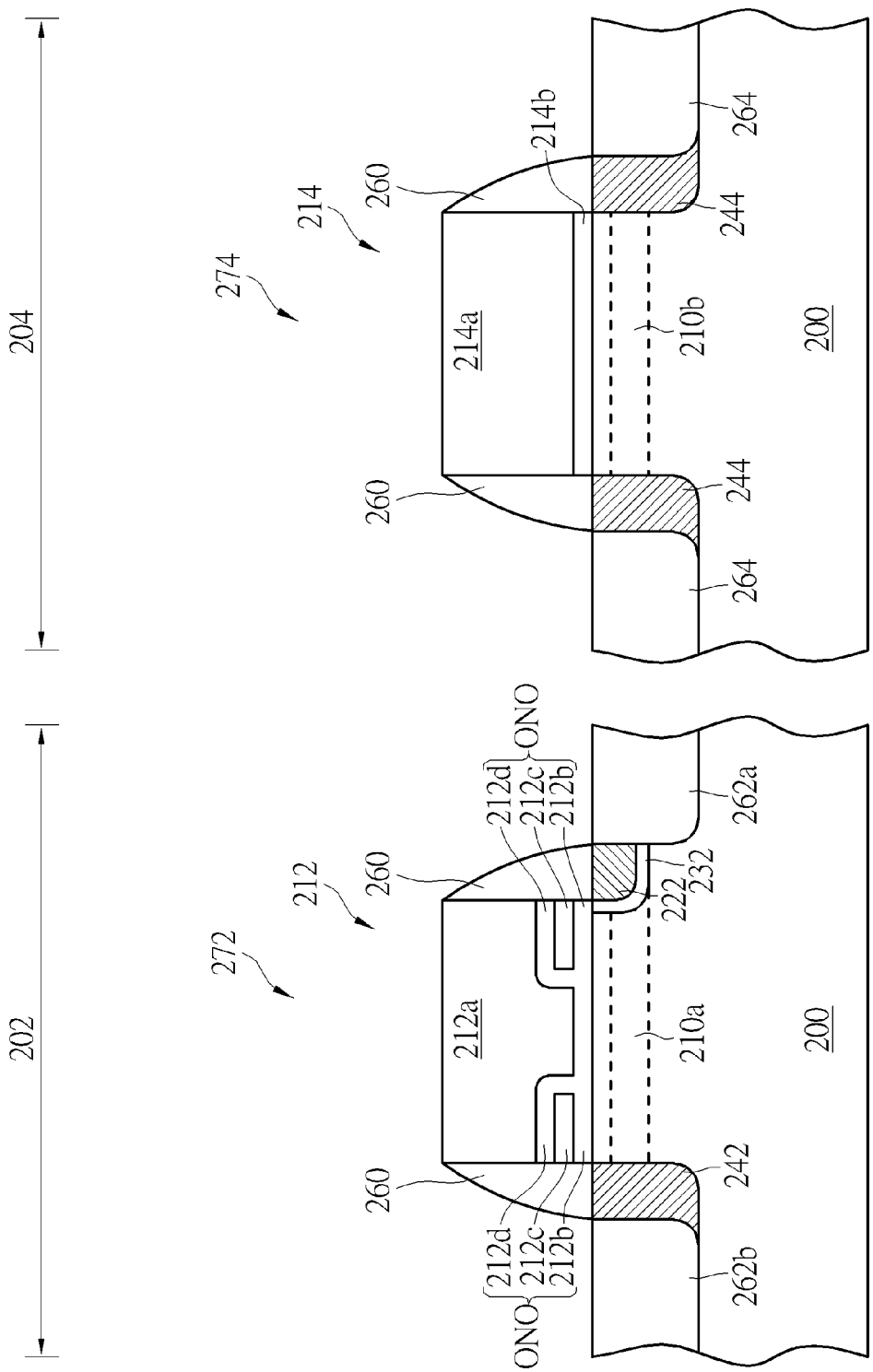

Please refer to FIG. 8. After forming the second LDD 242 and the third LDDs 244, and after selectively forming the second pocket doped region and the third pocket doped regions, a spacer 260 is respectively formed on sidewalls of the first gate stack 212 and of the second gate stack 214. Subsequently, an ion implantation is performed to form a source region 262a in the substrate 200 at the first LDD 222 side and a drain region 262b in the substrate 200 at the second LDD 242 side. Additionally, another ion implantation is performed to form a source/drain 264 in the substrate 200 at two sides of the second gate stack 214 in the logic region 204. Accordingly, an asymmetric memory cell structure 272 including the first LDD 222 and the second LDD 242 different from each other is obtained in the memory cell region 202 and a MOS transistor 274 is obtained in the logic region 204.

According to the method for forming the memory cell structure provided by the second preferred embodiment and the modification, the first LDD 222 and the second LDD 242 are formed by different LDD implantations 220/240. More important, the second LDD implantation 240 that is conventionally required to form the third LDDs 244 in the logic region 204, is now performed to further form the second LDD 242 in the memory cell region 202, simultaneously. It can be easily realized that the memory cell structure 272 provided by the preferred embodiment is formed without complicating the process. More important, the obtained memory cell structure 272 is an asymmetric memory cell structure 272 including the first LDD 222 and the second LDD 242 different from each other. Accordingly, the first LDD 222 and the second LDD 242 can include different dopants, a concentration of the first LDD 222 can be different from a concentration of the second LDD 242, and/or a depth of the first LDD 222 can be different from a depth of the second LDD 242. The second LDD 242 different from the first LDD 222 is formed at the drain side, also referred to the bit line side, and provides lower electric field. Specifically, the electric field in erasing operation is lower than the electric field in programming.

Figure 9:
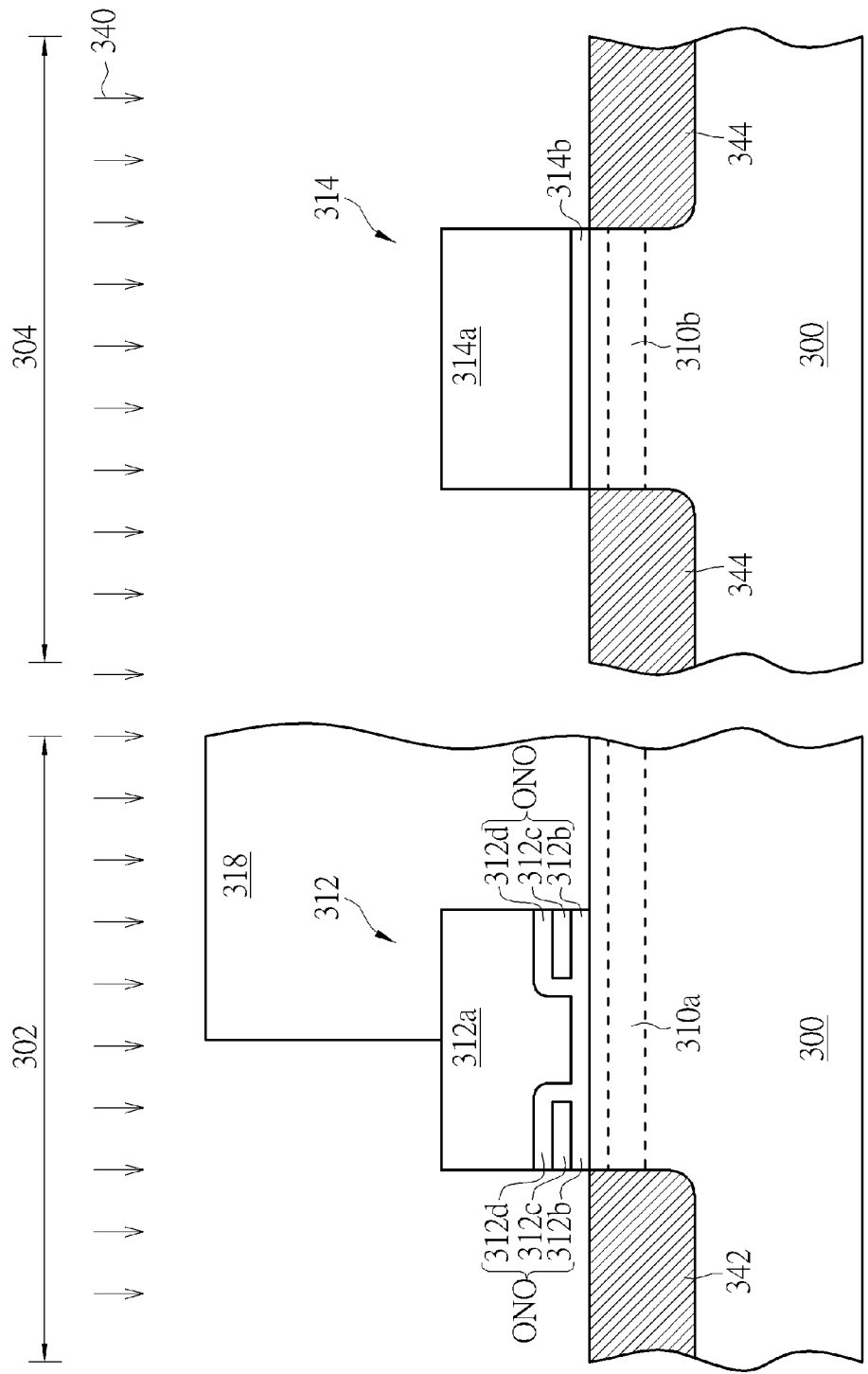
Figure 10:
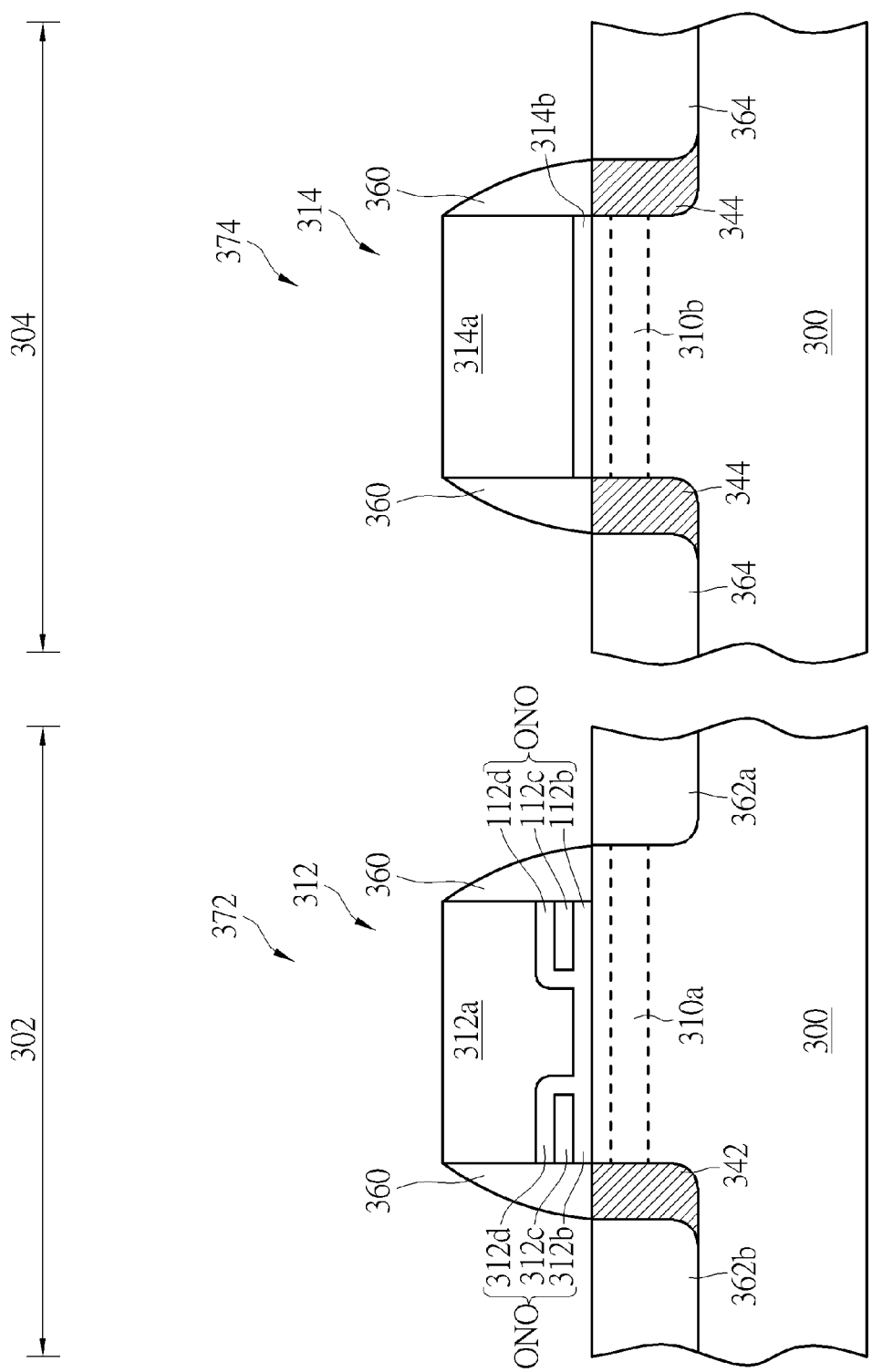

Please refer to FIGS. 9-10, which are schematic drawings illustrating a method for forming a memory cell structure provided by a third preferred embodiment of the present invention. Please refer to FIG. 9. According to the third preferred embodiment, a substrate 300 is provided. The substrate 300 includes a memory cell region 302 and a logic region 304 defined therein. A first ion implantation (not shown) is performed to form a first doped region 310a in the memory cell region 302, the first doped region 310a includes a first conductivity type. In the preferred embodiment, the first conductivity type includes p type. Accordingly, the first ion implantation is to implant, for example but not limited to, boron to form the first doped region 310a. Details of the first ion implantation are the same with those of the first ion implantation 210 described in the second preferred embodiment and thus are omitted for simplicity. It should be noted that, another ion implantation (not shown) is performed to form a second doped region 310b in the logic region 302. The abovementioned first ion implantation and the second ion implantation are referred to as threshold voltage adjustment implants or Vt adjustment implants. It is should be noted that the first ion implantation and the second ion implantation are referred to different ion implantations, but the step order of the abovementioned first ion implantation and second ion implantation is not limited to this. Accordingly, the preferred embodiment is to provide at least an n-type memory cell structure in the memory cell region 302 and at least an n-type device in the logic region 304.

Please refer to FIG. 9 again. Next, at least a first gate stack 312 is formed in the memory cell region 302 and at least a second gate stack 314 is formed in the logic region 304. And the first doped region 310a and the second doped region 310b are formed to alter or adjust the threshold voltages of the first gate stack 312 in the memory cell region 302 and the second gate stack 314 in the logic region 304, respectively. The first gate stack 312 includes a polysilicon gate layer 312a, two silicon oxide layers 312b/312d, and a silicon nitride layer 312c sandwiched between the two silicon oxide layers 312b/312d. The two silicon oxide layers 312b/312d and the silicon nitride layer 312c sandwiched therebetween construct an ONO structure. More important, each first gate stack 312 includes two ONO structures formed therein as shown in FIG. 9. Accordingly, the first gate stack 312 is a SONOS-type memory cell gate, particularly a 2-bit SONOS-type memory cell gate. On the other hand, the second gate stack 314 includes a gate layer 314a spaced apart from the substrate 300 by a gate dielectric layer 314b.

Please still refer to FIG. 9. After forming the first gate stack 312 and the second gate stack 314, a patterned mask 318 is formed on the substrate 300. It is noteworthy that the patterned mask 318 covers and protects portions of the memory cell region 302 and portions of the logic region 304. Particularly, the patterned mask 318 protects the portion of the memory cell region 302 where p-type devices are to be formed in accordance with the preferred embodiment. Then, a LDD implantation 340 is performed to implant a dopant of the second conductivity type into the substrate 300 exposed by the patterned mask 318. Consequently, a LDD 342 is formed in the substrate 300 at one side of the first gate stack 312 in the memory cell region 302. More important, the LDD implantation 340 is performed to simultaneously form LDDs 344 in the substrate 300 at two sides of the second gate stack 314 in the logic region 304. According to the preferred embodiment, the LDD implantation 340 is to implant, for example but not limited to, phosphorus to form the LDD 342 and the LDDs 344. An implant energy and a dose of the LDD implantation 340 are the same with those of the second LDD implantation 140 described in the first preferred embodiment and thus those details are omitted in the interest of brevity.

Additionally, according to a modification to the third preferred embodiment, a pocket implantation (not shown) can be performed to implant a dopant of the first conductivity type into the substrate 300 exposed by the patterned mask 318 if required. Thus a pocket doped region (not shown) around the LDD 342 is formed in the memory cell region 302 and packet doped regions (not shown) around the LDDs 344 are formed in the logic region 304. Details of the pocket implantation are the same with those of the second pocket implantation 150 described in the first preferred embodiment and thus are omitted in simplicity.

Please refer to FIG. 10. After forming the LDD 342 and the LDDs 344, and after selectively forming the pocket doped regions, a spacer 360 is respectively formed on sidewalls of the first gate stack 312 and of the second gate stack 314. Subsequently, an ion implantation is performed to form a source region 362a in the substrate 300 and a drain region 362b in the substrate 300 at the LDD 342 side. Additionally, another ion implantation is performed to form a source/drain 364 in the substrate 300 at two sides of the second gate stack 314 in the logic region 304. Accordingly, an asymmetric memory cell structure 372 including only one LDD 342 in the drain 362b side is obtained in the memory cell region 302 and a MOS transistor 374 is obtained in the logic region 304.

According to the method for forming the memory cell structure provided by the third preferred embodiment and its modification, the LDD implantation 340 that is conventionally required to form the LDDs 344 in the logic region 304, is now performed to further form the LDD 342 in the memory cell region 302, simultaneously. It can be easily realized that the memory cell structure 372 provided by the preferred embodiment is formed without complicating the process. More important, the obtained memory cell structure 372 is an asymmetric memory cell structure including only one LDD 342 in the drain 362b side, that is the bit line side, and provides lower electric field. Specifically, the electric field in erasing operation is lower than the electric field in programming.

According to the present invention, an asymmetric memory cell structure is provided by forming the first LDD and/or the second LDD different from each other. Thus, the electric field between the source side and the gate stack is different from the electric field between the drain side and the gate stack.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a memory cell structure, comprising:
providing a substrate comprising at least a memory cell region defined thereon and a first gate stack formed in the memory cell region, the first gate stack comprising two oxide-nitride-oxide (ONO) structures formed therein;
performing a first lightly-doped drain (LDD) implantation to form a first LDD comprising a first conductivity type at one side of the first gate stack in the memory cell region; and
performing a second LDD implantation to form a second LDD having the first conductivity type at one side of the first gate stack opposite to the first LDD in the memory cell region,
wherein the first LDD and the second LDD are different from each other.

2. The method for forming the memory cell structure according to claim 1, wherein the substrate further comprising a logic region and at least a second gate stack formed in the logic region.

3. The method for forming the memory cell structure according to claim 2, wherein the second LDD implantation is performed to simultaneously form third LDDs in the substrate at two sides of the second gate stack in the logic region.

4. The method for forming the memory cell structure according to claim 1, wherein a concentration of the first LDD is different from a concentration of the second LDD.

5. The method for forming the memory cell structure according to claim 1, wherein the first LDD and the second LDD comprise different dopants.

6. The method for forming the memory cell structure according to claim 1, wherein a depth of the first LDD is different from a depth of the second LDD.

7. The method for forming the memory cell structure according to claim 1, further comprising performing a first pocket implantation to form a first pocket doped region around the first LDD after the first LDD implantation, the first pocket doped region comprises a second conductivity type, and the second conductivity type is complementary to the first conductivity type.

8. The method for forming the memory cell structure according to claim 7, further comprising performing a second pocket implantation to form a second pocket doped region around the second LDD after the second LDD implantation, and the second pocked doped region comprises the second conductivity type.

9. A memory cell structure, comprising:
a substrate;
a gate stack formed on the substrate, the gate stack comprising two ONO structures formed therein;
a first LDD formed in the substrate at one side of the gate stack; and
a second LDD formed in the substrate at another side of the gate stack opposite to the first LDD, the first LDD and the second LDD comprising a same conductivity type,
wherein the first LDD and the second LDD are different from each other.

10. The memory cell structure according to claim 9, wherein a concentration of the first LDD is different from a concentration of the second LDD.

11. The memory cell structure according to claim 9, wherein the first LDD and the second LDD comprise different dopants.

12. The memory cell structure according to claim 9, wherein a depth of the first LDD is different from a depth of the second LDD.

13. A method for forming a memory cell structure, comprising:
providing a substrate comprising at least a memory cell region defined thereon;
performing a first ion implantation to form a first doped region in the memory cell region, the first doped region comprising a first conductivity type;
forming a first gate stack in the memory cell region after the first ion implantation, the first gate stack comprising two ONO structures formed therein;
performing a first LDD implantation to form a first LDD comprising a second conductivity type at one side of the first gate stack in the memory cell region, the first conductivity type and the second conductivity type are complementary to each other; and
performing a second LDD implantation to form a second LDD having the second conductivity type at one side of the first gate stack opposite to the first LDD in the memory cell region,
wherein the first LDD and the second LDD are different from each other.

14. The method for forming the memory cell structure according to claim 13, wherein a concentration of the first LDD is different from a concentration of the second LDD.

15. The method for forming the memory cell structure according to claim 13, wherein the first LDD and the second LDD comprise different dopants.

16. The method for forming the memory cell structure according to claim 13, wherein a depth of the first LDD is different from a depth of the second LDD.

17. The method for forming the memory cell structure according to claim 13, wherein the substrate further comprising a logic region and at least a second gate stack formed in the logic region, and the second LDD implantation is performed to simultaneously form third LDDs in the substrate at two sides of the second gate stack in the logic region.

* * * * *